(12) United States Patent
Watanabe et al.

(10) Patent No.: US 9,553,751 B2
(45) Date of Patent: Jan. 24, 2017

(54) DEMODULATION DEVICE

(71) Applicant: DENSO CORPORATION, Kariya, Aichi-pref. (JP)

(72) Inventors: Takamoto Watanabe, Kariya (JP); Shigenori Yamauchi, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 15/150,461

(22) Filed: May 10, 2016

(65) Prior Publication Data
US 2016/0337158 A1    Nov. 17, 2016

(30) Foreign Application Priority Data

May 14, 2015    (JP) .................................. 2015-99404

(51) Int. Cl.
| | | |
|---|---|---|
| H04B 1/16 | (2006.01) |
| H04L 27/14 | (2006.01) |
| H04L 27/22 | (2006.01) |
| H04L 27/26 | (2006.01) |
| H04B 1/00 | (2006.01) |

(52) U.S. Cl.
CPC ......... *H04L 27/2649* (2013.01); *H04B 1/0028* (2013.01); *H04B 1/16* (2013.01); *H04L 27/14* (2013.01); *H04L 27/22* (2013.01)

(58) Field of Classification Search
CPC ......... H04B 1/0028; H04B 1/16; H04L 27/14; H04L 27/22; H04L 27/2649
See application file for complete search history.

(56) References Cited

U.S. PATENT DOCUMENTS

| 5,396,247 A | 3/1995 | Watanabe et al. |
| 5,812,427 A * | 9/1998 | Nonoyama ........... G01P 15/124 324/166 |
| 6,255,976 B1 | 7/2001 | Watanabe et al. |
| 2005/0047526 A1 | 3/2005 | Watanabe et al. |

FOREIGN PATENT DOCUMENTS

| JP | H05-259907 | 10/1993 |
| JP | 2000-283790 A | 10/2000 |
| JP | 2005-102129 A | 4/2005 |
| JP | 2015-021782 | 2/2015 |

* cited by examiner

*Primary Examiner* — David B. Lugo
(74) *Attorney, Agent, or Firm* — Harness, Dickey & Pierce, P.L.C.

(57) ABSTRACT

A demodulation device for demodulating a base signal from a composite signal, which is composed of a carrier wave and a sensor modulation signal of the base signal. The demodulation device determines a difference between the composite signal of a former-half period and the composite signal of a latter-half period to be a pre-correction base signal. The former-half period is a one-half period of a sampling period starting at one of a local maximum and a local minimum of the carrier wave. The latter-half period follows the former-half period. The demodulation device determines a reference level from the composite signal and determines a signal level of a post-correction base signal based on a ratio between a signal level of the pre-correction base signal and the reference level.

11 Claims, 4 Drawing Sheets

DEMODULATION DEVICE

CROSS REFERENCE TO RELATED APPLICATION

The present application is based on Japanese patent application No. 2015-99404 filed on May 14, 2015, the content of which is incorporated herein by reference.

FIELD

The present disclosure relates to a demodulation device, which demodulates a base signal from a composite signal, which is composed of a carrier wave and a modulation signal of the base signal.

BACKGROUND ART

A composite signal is composed of a carrier wave and a modulation signal of a base signal superimposed on the carrier wave. For example, a micro-electro-mechanical system (MEMS) element of a tuning fork type provided in a gyro sensor vibrates in response to an element driving signal and outputs a composite signal, in which an angular velocity vibration signal is superimposed on the element driving signal. The angular velocity vibration signal vibrates in accordance with an angular velocity of the MEMS element. In this case, the element driving signal is a carrier wave and the angular velocity vibration signal is the modulation signal. The base signal is an angular velocity of the MEMS element.

This composite signal tends to change with factors (low-speed change factors), which changes at relatively low speed, such as temperature and low-frequency noise. For this reason, a demodulation device is required to detect the base signal from the composite signal by removing influence of the low-speed change factors.

JP 2000-283790 A (U.S. Pat. No. 6,255,976) discloses a process of removing from a general sensor signal unnecessary components, which are not a composite signal of a carrier wave and a modulation signal. In this process, unnecessary components included in a sensor output signal, which is a detection object signal, are removed by calculation of a ratio between an analog-digital (AD) conversion value of a predetermined reference signal and an AD conversion value of the sensor output signal.

Further, this process needs an analog switch to select by switching either one of the reference signal or the sensor output signal to be inputted to an AD conversion circuit to calculate the AD conversion value of the reference signal and the AD conversion value of the sensor output signal. This switch changeover operation need more time to finish the process of noise removal.

Further, the AD conversion value of the reference signal and the AD conversion value of the sensor output signal are acquired at different time points. Because of difference in time points of acquisition of the AD conversion values, influence of the low speed change factor is not removed sufficiently.

Further, since not only the analog switch but also an analog switch control circuit need be provided, a circuit size need be increased. Increases in the circuit size and the switch changeover process result in an increase in power consumption.

JP 2015-21782 A discloses a self-exciting resonance circuit for vibrating an element of a gyro sensor.

SUMMARY

The present disclosure addresses the problem described above and has an object to provide a demodulation device, which demodulates a base signal from a composite signal composed of a carrier wave and a modulation signal of the base signal without an analog switch.

According to one aspect, a demodulation device for demodulating a base signal from a composite signal, which is composed of a carrier wave and a modulation signal of the base signal, comprises a pre-correction base signal determination part, a reference level determination part and a base signal determination part. The pre-correction base signal determination part determines a difference between the composite signal of a former-half period and the composite signal of a latter-half period to be a pre-correction base signal of the base signal. The former-half period is a one-half period of a sampling period starting at one of a local maximum and a local minimum of the carrier wave. The latter-half period follows the former-half period. The reference level determination part determines a reference level from the composite signal. The base signal determination part determines a post-correction base signal based on a ratio between the pre-correction base signal determined by the pre-correction base signal determination part and the reference level determined by the reference level determination part.

DETAILED DESCRIPTION OF THE EMBODIMENT

A demodulation device will be described below with reference to plural embodiments and modifications.

First Embodiment

Figure 1:
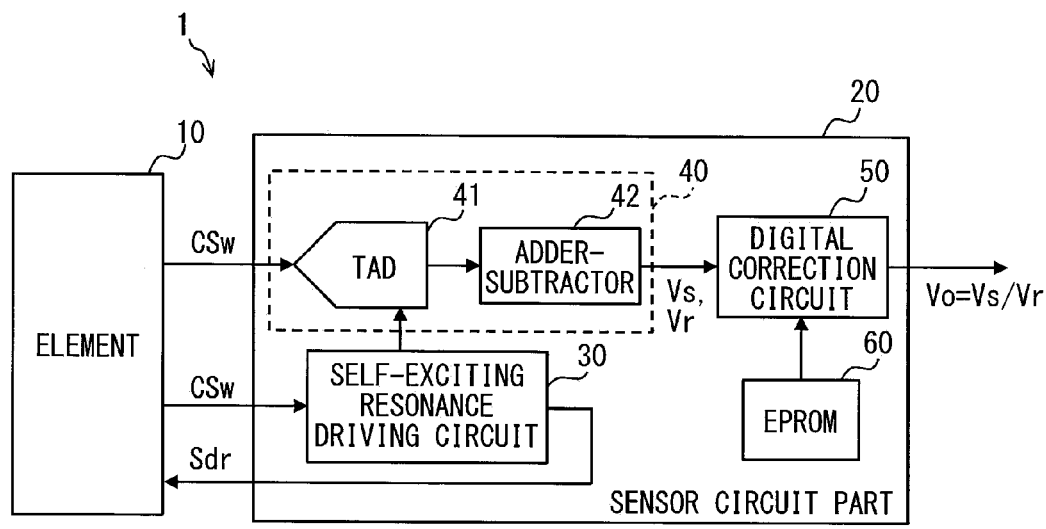
FIG. 1 is a block diagram of a gyro sensor device according to a first embodiment.

Referring first to FIG. 1, a gyro sensor device 1 includes a sensor element 10 and a sensor circuit part 20. The sensor circuit part 20 includes a self-exciting resonance driving circuit 30, a digital synchronous detection circuit 40, a digital correction circuit 50 and an EPROM 60. The sensor circuit part 20 operates as a demodulation device.

Figure 2:
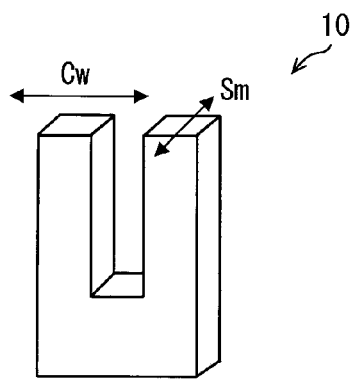
FIG. 2 is a schematic view showing a direction of vibration of an element shown in FIG. 1.

A driving signal Sdr is applied from the self-exciting resonance driving circuit 30 to the sensor element 10. The sensor element 10 is a MEMS tuning fork type element, which is conventional as shown in FIG. 2. In response to the driving signal Sdr, the sensor element 10 vibrates at a frequency of the driving signal Sdr. The vibration generated in response to the driving signal Sdr is referred to as driven vibration and a wave indicating the driven vibration is referred to as a carrier wave Cw.

As shown in FIG. 2, when external force is applied to the sensor element 10 in a direction of rotation, the sensor element 10 vibrates also in a direction, which is orthogonal to the carrier wave Cw (that is, driven vibration). Since the external force applied to the sensor element 10 is a signal modulated by the driven vibration, this vibration is referred to as a sensor modulation signal Sm. The sensor modulation signal Sm is phase-shifted by 90 degrees relative to the carrier wave Cw.

The sensor element 10 generates a composite signal CSw, which is composed of the carrier wave Cw and the sensor modulation signal Sm superimposed on the carrier wave Cw. The composite signal CSw is generated from the sensor element 10 as an analog signal.

Figure 3:
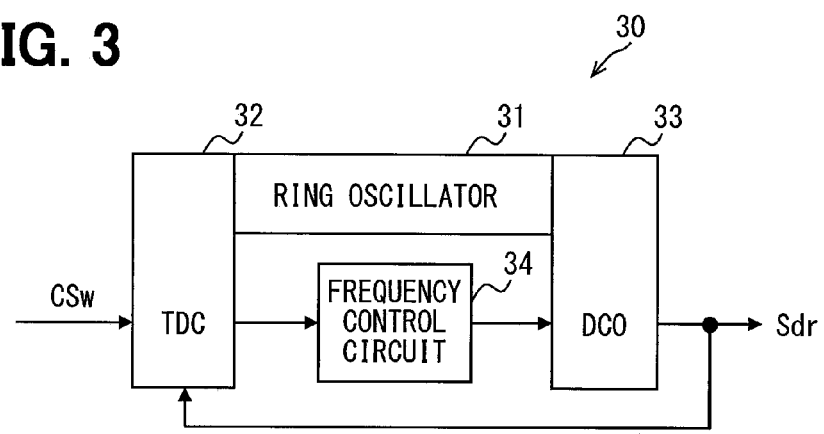
FIG. 3 is a block diagram of a self-exiting resonance driving circuit shown in FIG. 1.

The self-exciting resonance driving circuit 30 receives the composite signal CSw and generates the driving signal Sdr based on the received composite signal CSw. The self-exciting resonance driving circuit 30 is the same as a conventional self-exciting resonance circuit. The self-exciting resonance driving circuit 30 includes, as shown in FIG. 3, a ring oscillator 31, a time-to-digital converter (TDC) 32, a digitally-controlled oscillator (DCO) 33 and a frequency control circuit 34.

The ring oscillator 31 is a digital oscillation circuit. The ring oscillator 31 is a conventional circuit, which includes plural inverter circuits connected in a ring form so that each inverter circuit inverts and circulates an input signal applied as a pulse signal. Each inverter circuit outputs from its output terminal a pulse signal having a cycle period, which is as long as a factor of constant of an inverting operation time of each inverter circuit. Pulse signals outputted from plural output terminals are applied to the TDC 32 and the DCO 33.

The composite signal CSw is applied to the TDC 32 and the driving signal Sdr is applied to the TDC 32 by feedback from the DCO 33. The TDC 32 detects as digital time information a phase difference of the composite signal CSw relative to the driving signal Sdr. Specifically, this phase difference is acquired by measuring a time difference from a pulse rising of the driving signal Sdr and a pulse rising of the composite signal CSw. In measuring this time difference, the TDC 32 uses the pulse signal generated by the ring oscillator 31 as a clock pulse.

The DCO 33 outputs the driving signal, which has a period corresponding to a control signal applied from the frequency control circuit 34. In determining this period, the DCO 33 uses the pulse signal generated by the ring oscillator 31 as a clock pulse. The driving signal Sdr generated by the DCO 33 is applied to the sensor element 10 and the TDC 32.

The frequency control circuit 34 controls the period of the driving signal (that is, frequency of the driving signal Sdr) so that the phase difference detected by the TDC 32 equals a predetermine resonance phase difference. The frequency control circuit 34 performs this control by applying the control signal, which is digital, to the DCO 33. The resonance phase difference is a phase difference between a phase of the external force and a phase of vibration of a body when the body is in a state of resonance. This resonance phase difference is known as about 90 degrees. However, this difference often deviates from 90 degrees because of various conditions. The resonance phase difference is sometimes set to 87 degrees, for example, as a specific value.

The frequency control circuit 34 controls the frequency of the driving signal applied to the sensor element 10, because the vibration phase of the sensor element 10 deviates relative to the phase of the external force applied to the sensor element 10 in accordance with the frequency of the driving signal. Specifically, the phase delay of the vibration phase of the sensor element 10 relative to the phase of the external force is smaller than the resonance phase difference, which is about 90 degrees, when the frequency is lower than the resonance frequency. On the other hand, the phase delay of the vibration phase of the sensor element 10 relative to the phase of the external force is larger than the resonance phase difference, when the frequency is higher than the resonance frequency. It is thus possible to regulate a detected phase difference by increasing and decreasing the frequency of the driving signal Sdr.

The digital synchronous detection circuit 40 extracts a base signal Sba from the composite signal CSw by synchronous detection. The base signal is specifically an angular velocity signal. The digital synchronous detection circuit 40 includes a time AD conversion circuit (TAD) 41 and an adder-subtractor 42.

Figure 4:
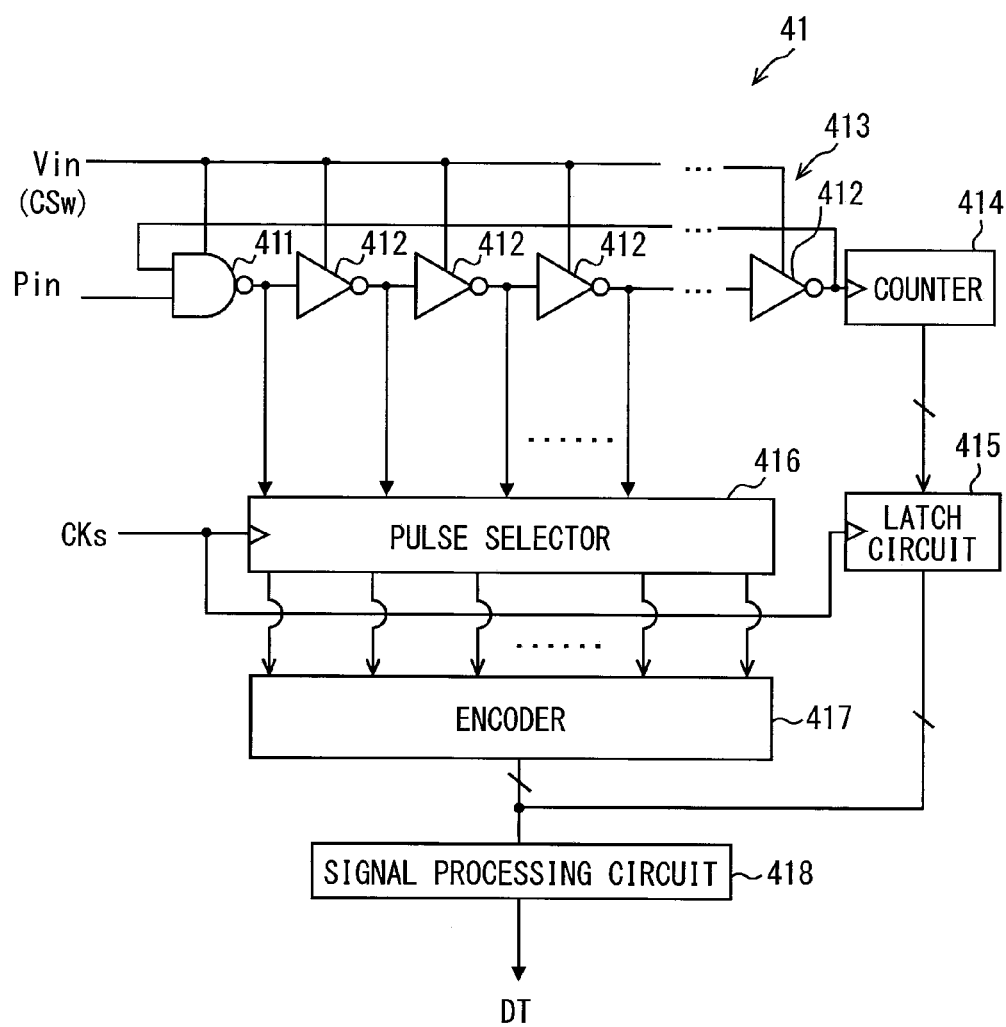
FIG. 4 is a circuit diagram of a TAD shown in FIG. 1.

The TAD 41 is conventional and configured as shown in FIG. 4. The TAD 41 includes a NAND gate 411, a ring gate delay circuit 413, a counter 414, a latch circuit 415, a pulse selector 416, an encoder 417 and a signal processing circuit 418. The ring gate delay circuit 413 is formed of even number of inverters 412 connected in a ring form. The inverter 412 is a pulse signal delay unit and the ring gate delay circuit 413 operates as a pulse delay circuit.

The TAD 41 is an AD conversion circuit of a variable input voltage type. The composite signal CSw is applied to the NAND gate 411 and the inverter 412 as an input voltage Vin. Time of one complete circulation of a pulse signal Pin through the ring gate delay circuit 413 varies with a level of the composite signal CSw. The counter 414 counts the number of times of complete circulations of the pulse signal Pin through the ring gate delay circuit 413. The latch circuit 415 latches a count value of the counter 414. The pulse selector 416 detects a position of circulation of the pulse signal in the ring gate delay circuit 413. The encoder 417 outputs the circulation position detected by the pulse selector 416 as a digital value.

The signal processing circuit 418 determines the number of circulations of the pulse signal Pin through the ring gate delay circuit 413 and the circulation position of the pulse signal Pin in the ring gate delay circuit 413 based on output signals from the latch circuit 415 and the encoder 417 each time a sampling clock CKs is applied.

In the first embodiment, a frequency of the sampling clock signal CKs (that is, sampling frequency fs) is set to be twice as large as a carrier wave frequency fc. Thus, a sampling period Ts is set to be one-half of a carrier wave period Tc as shown in (b) and (c) of FIG. 5. The TAD 41 determines timing of generation of the sampling clock signal CKs by acquiring the driving signal Sdr (that is, carrier wave) from the self-exciting resonance driving circuit 30.

The TAD 41 configured as described above outputs an average level of the composite signal in an interval between the sampling periods Ts.

The adder-subtractor 42 calculates a difference between a former-half composite signal level and a latter-half composite signal level outputted from the TAD 41. The former-half composite signal level is a level of the composite signal CSw in a former one-half period of the carrier wave. The latter-half composite signal level is a level of the composite signal CSw in a latter one-half period of the carrier wave. The adder-subtractor 42 calculates a sum of the former-half composite signal level and the latter-half composite signal level, which are outputted from the TAD 41.

As described below, the difference described above is a signal level Vs of a pre-correction base signal Sba1, which is not corrected, and the sum described above is the average level of the carrier wave. That is, the adder-subtractor 42 calculates the signal level Vs of the pre-correction base signal Sba1 and the average level of the carrier wave Cw. The average level of the carrier wave Cw is used as a reference level Vr. Thus the adder-subtractor 42 operates as a pre-correction base signal determination part and a reference level determination part.

The digital correction circuit 50 uses as the reference level Vr the average level of the carrier wave Cw, which is calculated by the adder-subtractor 42, and calculates as a signal level Vo of a true base signal Sba2 a ratio (=Vs/Vr) of the signal level Vs of the base signal Sba relative to the reference level Vr. In addition, the signal level Vo of the true base signal Sba2 to be outputted may be corrected with respect to sensitivity. The EPROM 60 stores therein a sensitivity correction coefficient, which is used in the digital correction circuit 50. The signal level Vo of the true base signal Sba2 is a signal level of a post-correction base signal, which is corrected. The digital correction circuit 50 thus operates as a base signal determination part.

The difference and the sum, which are calculated by the adder-subtractor 42, become the signal level Vs of the pre-correction base signal Sba1 and the average level of the carrier wave, respectively, as described below with reference to FIG. 5. The difference becomes the signal level Vs of the base signal Sba1 as described below.

Figure 5:
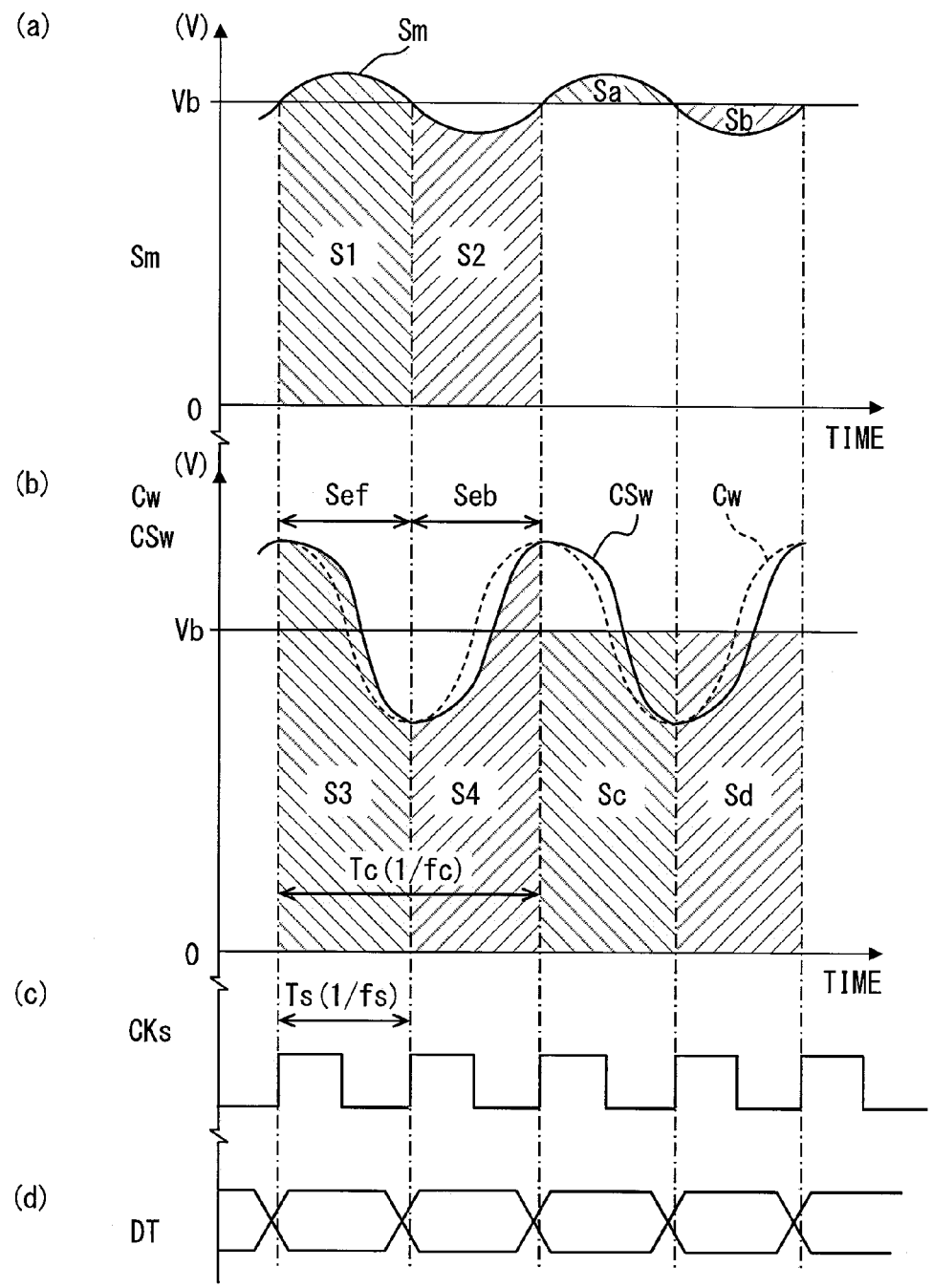
FIG. 5 is a time chart showing an operation of addition and subtraction of an adder-subtractor shown in FIG. 1.

In FIG. 5, (b) shows the composite signal CSw and (a) shows the sensor modulation signal Sm included in the composite signal CSw. (c) shows the sampling period Ts and (d) shows the digital data DT outputted from the TAD 41.

The adder-subtractor 42 calculates the difference between the average levels of the composite signal CSw in the former-half sampling period Sef and the latter-half sampling period Seb in one cycle period shown in FIG. 5. This means calculation of a difference between areas S3 and S4 shown in (b).

The former-half sampling period Sef starts from a local maximum of the carrier wave Cw and ends at a local minimum of the carrier wave Cw. Since the sensor modulation signal Sm is out of phase by 90 degrees from the carrier wave Cw, the former-half sampling period Sef is from 0 degree to 180 degrees of the sensor modulation signal Sm.

The latter-half sampling period Seb starts from the local minimum of the carrier wave Cw and ends at a local maximum of the carrier wave Cw. The latter-half sampling period Seb is from 180 degrees to 360 degrees of the sensor modulation signal Sm.

As understood from (b), the average levels of the carrier waves Cw in the former sampling period Sef and the latter sampling period Seb are equal to each other.

For this reason, the component of the carrier wave Cw is removed by calculating the difference between the average levels of the composite signal CSw in the former sampling period Sef and the latter-half sampling period Seb. This difference thus indicates the level of the sensor modulation signal Sm.

The area difference S3−S4 corresponds to an area difference S1−S2 of the sensor modulation signal Sm shown in (a). This corresponds to a sum of the areas Sa and Sb shown in (a).

For this reason, by calculating the difference between the average levels of the composite signal CSw in the former-half sampling period Sef and the latter-half sampling period Seb, the signal level Vs of the pre-correction base signal Sba1 of the sensor modulation signal Sm is calculated.

Thus, the difference between the average levels of the composite signal CSw in the former-half sampling period Sef and the latter-half sampling period Seb becomes the signal level Vs of the pre-correction base signal Sba1.

The sum calculated by the adder-subtractor 42 becomes the average level of the carrier wave as described below with reference to FIG. 5. The sum is calculated as a sum S3+S4 of areas S3 and S4 shown in (b).

As understood from (b), both average levels of the carrier wave Cw in the former-half sampling period Sef and the latter-half sampling period Seb become the average level of the carrier wave Cw, that is, a bias level Vb. The sum of areas S3+S4 corresponds to a difference Sa−Sb of areas of the sensor modulation signal Sm shown in (a). Thus, the sum of areas S3+S4 corresponds to the sum of areas Sc+Sd.

Thus, the sum of the average levels of the composite signal CSw in the former-half sampling period Sef and the latter-half sampling period Seb becomes the average level Vs of the carrier wave Cw.

Any one of the signal level Vs of the pre-correction base signal Sba1 and the reference level Vr, that is, the average level of the carrier wave Cw, is possibly influenced by low-speed change factors such as temperature change.

Therefore, the ratio Vs/Vr is determined to be the signal level Vo of the true base signal Sba2 in the digital correction circuit 50. Since both of the denominator and the numerator are influenced by the same low-speed change factor, the signal level Vo is free from the influence of the low-speed change factor. For this reason, Vs/Vr is used as the signal level Vo of the true base signal Sga2.

Here, the signal level Vo of the true base signal Sba2 calculated under a predetermined standard condition is assumed to be Voa. The bias level Vb is assumed to decrease 30% because of temperature change. This state is referred to as a condition change state. In this case, the level of the base signal Sba1 of the pre-correction base signal Sba1 decreases 30% from the pre-correction base signal Sba1 of the standard condition. However, the reference level Vr also decreases 30% from that of the standard condition.

For this reason, in a condition change state, a signal level Vob of the true base signal Sba2 equals the signal level Voa of the true base signal Sba2 in the standard condition. Thus, by determining the ratio Vs/Vr to be the signal level Vo of the true base signal Sba2, the influence of the low-speed change factor is removed.

The gyro sensor device 1 according to the first embodiment has no analog switches. As a result, the signal processing time is shortened. The reference level Vr and the signal level Vs of the pre-correction base signal Sb1 are acquired almost at the same time point. The circuit size and the power consumption need not be increased.

Second Embodiment

A second embodiment will be described next with reference to FIG. 6. In the second embodiment and modifications of the embodiments described below, the same structural parts are designated with the same reference numerals as the first embodiment to simplify the description.

The second embodiment is different from the first embodiment in the sampling period Ts of the TAD 41, calculation by the adder-sutractor 42 and the signal processing by the digital correction circuit 50. Further, in the second embodiment, a magnitude level (amplitude) Ac of the carrier wave Cw is used as the reference level Vr.

In the second embodiment, the frequency of the sampling clock signal CKs (that is, sampling frequency fs) is set to be four times as high as the carrier wave frequency fc. That is, the sampling period Ts is set to be one-quarter of the one cycle period Ts of the carrier wave Cw.

The adder-subtractor 42 divides one cycle period of the carrier wave Cw into a first sampling period Se1, a second sampling period Se2, a third sampling period Se3 and a fourth sampling period Se4, all of which are equally one-quarter length of the period of the carrier wave Cw.

The adder-subtractor 42 calculates a first sum of the composite signals CSw, which are outputted from the TAD 41 in the first sampling period Se1 and the second sampling period Se2, respectively. The adder-subtractor 42 further calculates a second sum of the composite signals CSw, which are outputted from the TAD 41 in the third sampling period Se3 and the fourth sampling period Se4, respectively. The adder-subtractor 42 then calculates a difference between the first sum and the second sum.

Figure 6:
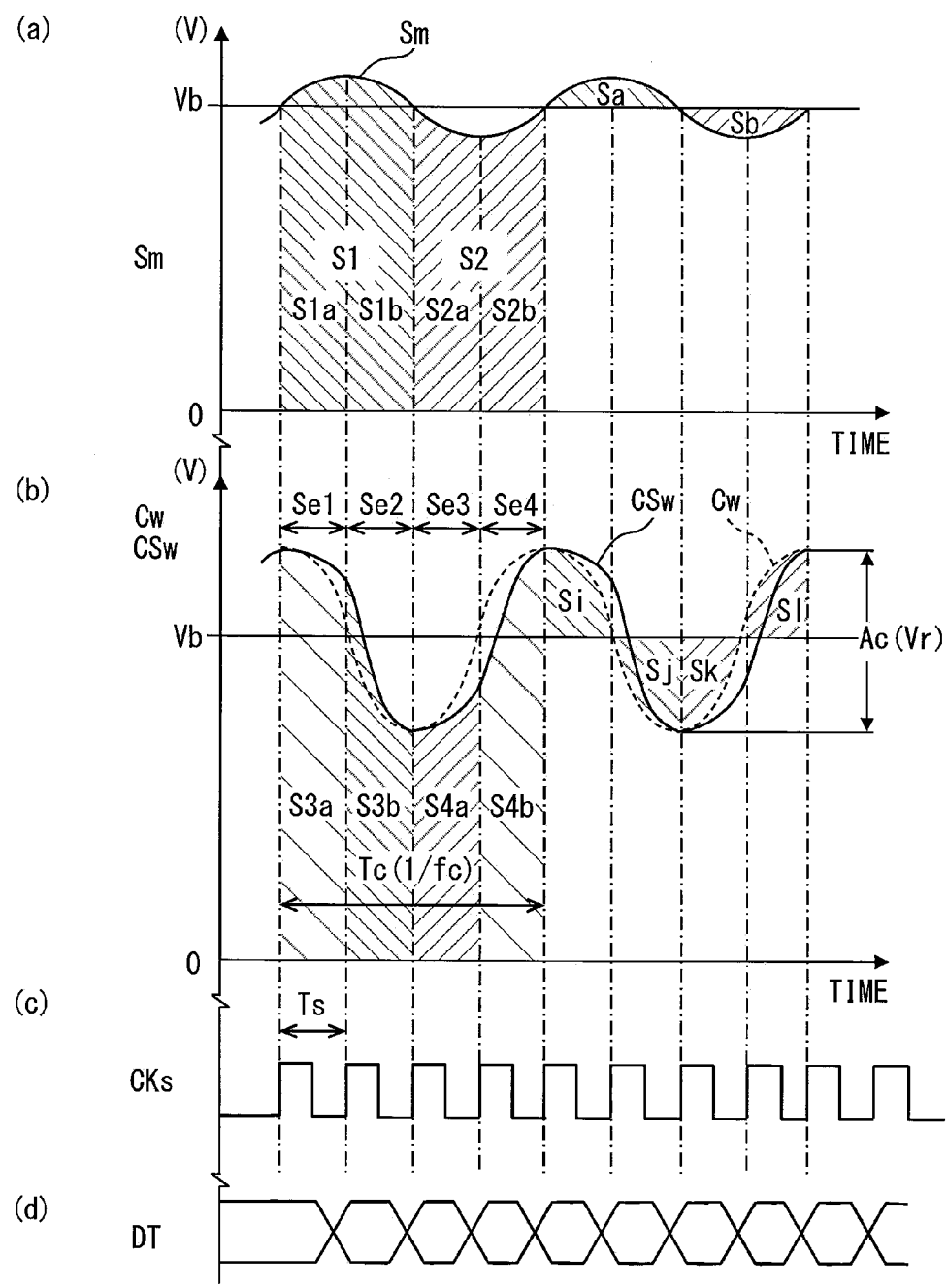
FIG. 6 is a time chart showing an operation of addition and subtraction of the adder-subtractor in a second embodiment.

As shown in (b) of FIG. 6, the levels of the composite signal CSw in the first sampling period Se1 and the second sampling period Se2 indicate areas S3*a* and S3*b*, respectively. A first sum S3 thus indicates a sum of areas S3*a* and S3*b*.

The levels of the composite signal CSw in the third sampling period Se3 and the fourth sampling period Se4 indicate areas S4*a* and S4*b*, respectively. A second sum S4 thus indicates a sum of areas S4*a* and S4*b*.

Thus a difference between the first sum S3 and the second sum S4 indicates a difference of areas S3–S4. As shown in (a), the area S3 corresponds to the sum of the areas S1*a* and S1*b*, that is, the area S1 of the sensor modulation signal Sm. The area S4 corresponds to the sum of the areas S2*a* and S2*b*, that is, the area S2 of the sensor modulation signal Sm. The difference between the first sum and the second sum becomes the signal level Vs of the pre-correction base signal Sba1.

The adder-subtractor 42 further calculates a difference (first difference) between the composite signals CSw of the first sampling period Se1 and the second sampling period Se2, which are outputted from the TAD 41. The adder-subtractor 42 also calculates a difference (second difference) between the composite signals CSw of the third sampling period Se3 and the fourth sampling period Se4, which are outputted from the TAD 41. The adder-subtractor 42 then calculates a difference between the first difference and the second difference.

The first difference indicates the difference S3*a*–S3*b* between areas S3*a* and S3*b* shown in (b). As understood from (a), the levels of the sensor modulation signal Sm are the same between the first sampling period Se1 and the second sampling period Se2. Thus the component of the sensor modulation signal Sm is removed by calculation of the first difference.

The second difference indicates the difference S4*a*–S4*b* between areas S4*a* and S4*b* shown in (b). As understood from (a), the levels of the sensor modulation signal Sm are the same between the third sampling period Se3 and the fourth sampling period Se4. Thus the component of the sensor modulation signal Sm is removed by calculation of the second difference.

As a result, the difference between the first difference and the second difference, that is, (S3*a*–S3*b*)–(S4*a*–S4*b*), corresponds to the sum of areas Si, Sj, Sk and Sl shown in (b).

The sum of areas Si+Sj+Sk+Sl indicates the magnitude level Ac of the carrier wave Cw. In the second embodiment, the magnitude level Ac is used as the reference level Vr. After calculating the reference level Vr, the ratio Vs/Vr is used as the signal level Vo of the true base signal Sba2 in the similar manner as in the first embodiment.

The present invention should not be limited to the embodiments described above but may be implemented differently with modifications as exemplified below.

First Modification

In the first and second embodiments described above, the carrier wave Cw and the sensor modulation signal Sm are in the orthogonal relation by setting the frequency of the carrier wave Cw to be equal to that of the sensor modulation signal Sm and setting the phase of the sensor modulation signal Sm to be shifted by 90 degrees relative to that of the carrier wave Cw. Alternatively, the carrier wave Cw and the sensor modulation signal Sm may be in the orthogonal relation by setting the frequency of the sensor modulation signal Sm to be integer times, for example, two or four times, as high as that of the carrier wave Cw. As far as the carrier wave Cw and the sensor modulation signal Sm are in the orthogonal relation, the signal level Vo of the true base signal is acquired from the composite signal CSw by the method described with reference to the first embodiment and the second embodiment.

Second Modification

In the first and second embodiments described above, the sampling is started at the time point of the local maximum of of the carrier wave Cw. Alternatively, the sampling may be started at a time point of the local minimum of the carrier wave Cw.

Third Modification

In the first and second embodiments described above, the composite signal CSw, which is the analog signal, is converted into the digital data by the TAD 41. Alternatively, the composite signal CSw may be converted into the digital signal by an analog-digital (AD) conversion circuit other than the TAD 41. Further, the composite signal CSw, which is the analog signal, may be subjected to the addition and subtraction processing to determine the pre-correction base signal and the reference level.

Fourth Modification

In the first and second embodiments described above, the composite signal CSw is the voltage signal. Alternatively, the composite signal CSw may be a current signal.

What is claimed is:

1. A demodulation device for demodulating a base signal from a composite signal, which is composed of a carrier wave and a modulation signal of the base signal, the demodulation device comprising:
a pre-correction base signal determination part, which determines a difference between the composite signal of a former-half period and the composite signal of a latter-half period to be a pre-correction base signal of the base signal, the former-half period being a one-half period of a sampling period starting at one of a local maximum and a local minimum of the carrier wave and the latter-half period following the former-half period;
a reference level determination part, which determines a reference level from the composite signal; and
a base signal determination part, which determines a post-correction base signal based on a ratio between the pre-correction base signal determined by the pre-correction base signal determination part and the reference level determined by the reference level determination part.

2. The demodulation device according to claim 1, wherein:
the reference level determination part determines the reference level to be a sum of the composite signal in the former-half period and the composite signal in the latter-half period.

3. The demodulation device according to claim 1, wherein:
the former-half period is divided into a first sampling period and a second sampling period and the latter-half period is divided into a third sampling period and a fourth sampling period, each of the first to fourth sampling period equals one-quarter period of the carrier wave after starting of sampling; and
the reference level determination part calculates a first difference between the composite signal in the first sampling period and the composite signal in the second sampling period, a second difference between the composite signal in the third sampling period and the composite signal in the fourth sampling period, and a difference between the first difference and the second difference as the reference level.

4. The demodulation device according to claim 1, wherein:
the modulation signal is in an orthogonal relation to the carrier wave.

5. The demodulation device according to claim 4, wherein:
a phase of the modulation signal is shifted by 90 degrees from a phase of the carrier wave.

6. The demodulation device according to claim 4, wherein:
a frequency of the modulation signal is integer times as high as a frequency of the carrier wave.

7. The demodulation device according to claim 1, further comprising:
an AD conversion circuit, which receives the carrier wave as an analog signal and outputs the carrier wave as a digital data, wherein:
the pre-correction base signal determination part determines the pre-correction base signal based on the digital data outputted from the AD conversion circuit; and
the reference level determination part determines the reference level based on the digital data outputted from the AD conversion circuit.

8. The demodulation device according to claim 7, wherein:
the AD conversion circuit includes a pulse delay circuit, which is formed of plural pulse signal delay units connected in series and to which the composite signal is applied as an input signal; and
the AD conversion circuit converts the carrier wave into the digital data based on a number of the pulse signal delay units, through which a pulse signal passed at every predetermined time.

9. The demodulation device according to claim 1, wherein:
the composite signal is a voltage signal.

10. The demodulation device according to claim 1, wherein:
the composite signal is a current signal.

11. A gyro sensor device comprising:
the demodulation device according to claim 1; and
a sensor element, which generates the composite signal including the base signal, which is modulated to in accordance with external force applied to the sensor element.

* * * * *